United States Patent [19]

Farley et al.

[11] Patent Number: 5,182,469
[45] Date of Patent: Jan. 26, 1993

[54] INTEGRATED CIRCUIT HAVING BIPOLAR TRANSISTORS AND FIELD EFFECT TRANSISTORS RESPECTIVELY USING POTENTIALS OF OPPOSITE POLARITIES RELATIVE TO SUBSTRATE

[75] Inventors: Joseph D. Farley, Villeneuve Loubet, France; Frank Fattori, Bedford, England

[73] Assignee: Texas Instruments Incorporated, Dallas, Tex.

[21] Appl. No.: 460,688

[22] Filed: Jan. 4, 1990

Related U.S. Application Data

[63] Continuation of Ser. No. 251,926, Sep. 28, 1988, abandoned, which is a continuation of Ser. No. 849,100, Apr. 7, 1986, abandoned.

[30] Foreign Application Priority Data

May 15, 1985 [GB] United Kingdom ............... 8511256

[51] Int. Cl.$^5$ ............................................. H01L 27/04
[52] U.S. Cl. ............................ 307/296.2; 257/378; 257/546
[58] Field of Search ..................... 357/43, 48, 42; 307/296.2

[56] References Cited

U.S. PATENT DOCUMENTS

| | | | |
|---|---|---|---|
| 4,047,217 | 9/1977 | McCaffery et al. | 357/43 |
| 4,054,898 | 10/1977 | Streit et al. | 357/46 |
| 4,063,273 | 12/1977 | Mueller | 357/43 |
| 4,224,634 | 9/1980 | Svedberg | 357/43 |
| 4,225,877 | 9/1980 | Miles et al. | 357/43 |
| 4,327,368 | 4/1982 | Uchida et al. | 357/43 |
| 4,402,003 | 8/1983 | Blanchard | 357/43 |
| 4,473,758 | 9/1984 | Huntington | 307/296 |
| 4,494,134 | 1/1985 | Wildi et al. | 357/43 |
| 4,506,282 | 3/1985 | Baliga | 357/43 |
| 4,546,370 | 10/1985 | Curran | 357/43 |
| 4,549,096 | 10/1985 | Hoffmann | 307/297 |
| 4,577,211 | 3/1986 | Bynum et al. | 357/34 |
| 4,586,243 | 5/1986 | Weaver, II et al. | 357/34 |
| 4,628,340 | 12/1986 | Hashimoto | 357/23.1 |

FOREIGN PATENT DOCUMENTS

| | | | |
|---|---|---|---|
| 1218603 | 1/1971 | United Kingdom | 357/34 |
| 1405503 | 9/1975 | United Kingdom | 357/34 |

OTHER PUBLICATIONS

Briot, "Linear Voltage Regulation J. Temp.," IBM Tech. Discl. Bulletin, pp. 1253–1254, Oct. 1970.

*Primary Examiner*—William D. Larkins
*Attorney, Agent, or Firm*—William B. Hiller; Richard L. Donaldson

[57] ABSTRACT

An integrated circuit having a first group of semiconductor components which use potentials which are positive with respect to the substrate and a second group of components which use potentials which are negative with respect to the substrate. A negative voltage regulator circuit suitable for use in telephone circuits is described in which the regulated output is produced at the substrate so that noise can be prevented from being capacitatively coupled from the substrate to the input stages of amplifiers in the same integrated circuit. The exemplary circuit is produced by the so-called BIDFET process and use both bipolar and field effect transistors. One semiconductor component described includes an enhancement mode MOSFET with a channel in the surface of an epitaxial layer and a drain region forming the base of a bipolar transistor using the epitaxial layer as a collector region, there being a highly doped buried layer of the same conductivity type as the epitaxial layer at the interface between it and the substrate which is of the opposite conductivity type.

12 Claims, 3 Drawing Sheets

INTEGRATED CIRCUIT HAVING BIPOLAR TRANSISTORS AND FIELD EFFECT TRANSISTORS RESPECTIVELY USING POTENTIALS OF OPPOSITE POLARITIES RELATIVE TO SUBSTRATE

This application is a continuation of application Ser. No. 251,926 filed Sept. 28, 1988, now abandoned, which is a continuation of application Ser. No. 849,100 filed Apr. 7, 1986, now abandoned.

This invention relates to integrated circuits and is of particular value in so-called linear circuits, although it may also have uses in digital circuits.

It is economically advantageous to provide as many parts of a system as possible on the same integrated circuit since most if not all of the interconnections between the parts can be formed during the manufacture of the circuit with no extra processing steps and only a small amount of additional complication in the metallisation patterns. There are, of course, limitations on the maximum size of an integrated circuit depending on the likely spacing between crystal dislocations of the substrate semiconductor material, but there are many useful combinations of system parts which could be made on single integrated circuits without approaching this limitation. There is, however, another problem which can arise with such combinations and that is that noise can be generated in one system part which could easily be filtered out in the connection to another system part when they are in separate integrated circuits, but which is communicated at an unacceptably high level to the other system part through the common substrate when they are in the same integrated circuit. One such combination of parts is a negative polarity switched mode power supply circuit and an amplifier using the power supply; in this combination the switching pulses of the power supply circuit are picked up by the more sensitive input stages of the amplifier and amplified by it. A particular application for this integrated circuit is in a subscriber's line interface circuit (SLIC) where a negative polarity power supply is required to be used for compatibility with other telephone system components.

Dielectric isolation has been used in integrated circuits to isolate components operating with voltages of different polarity relative to the substrate but this is expensive to implement. Diode pumps have been employed to provide the substrate bias required for the operation of such a circuit but these have the disadvantage that they introduce noise into the circuit.

It is an object of the present invention to provide an improved integrated circuit in which the problem of coupling between parts of the circuit through the substrate can be overcome.

According to one aspect of the present invention there is provided an integrated circuit including a plurality of semiconductor components on a common substrate of semiconductor material wherein a first group of the components uses potentials which are positive with respect to the substrate and a second group of the components uses potentials which are negative with respect to the substrate, reverse biased PN junctions being provided where necessary in the circuit to isolate the components from each other.

According to another aspect of the present invention there is provided an integrated circuit having a semiconductor substrate of a first conductivity type on one surface of which is deposited a lightly doped epitaxial layer of a second conductivity type opposite to the first, the epitaxial layer being divided into sections by isolating regions extending through it to the substrate, one or more first transistors being formed in certain sections of the epitaxial layer and in other sections of the epitaxial layer there are formed wells of the first conductivity type in the surface of which are formed field effect transistors, the first and field effect transistors being interconnected in a single circuit in which the first transistors use potentials of one polarity relative to the substrate and the field effect transistors use potentials of polarity opposite to the one polarity relative to the substrate.

Integrated circuits according to the invention can conveniently be manufactured using the so-called BID-FET technology described in Electronics dated 5th April 1984 on page 149. In this technology an epitaxial layer of one conductivity type is formed on a substrate of the opposite conductivity type and highly doped diffusion under film regions of the one conductivity type are formed along the interface of the epitaxial layer and the substrate.

The integrated circuit may include a transistor circuit construction having a MOSFET input element directly connected to a bipolar output element in which the drain of the MOSFET is formed by the same region as forms the base of the bipolar element. The element may be formed in the surface of an epitaxial layer which itself forms the channel of the MOSFET and the collector of the bipolar element. A high conductivity diffusion under film region of the same conductivity type as the epitaxial layer may be formed along the interface of the epitaxial layer and the substrate, which is of opposite conductivity type to the epitaxial layer. Both the bipolar element and the MOSFET element operate as surface devices and are isolated from the substrate.

According to a further aspect of the invention there is provided a component of an integrated circuit on an epitaxial layer of a second conductivity type having an enhancement mode MOSFET with an insulated gate overlying the surface of the epitaxial layer between source and drain regions of a first conductivity type in the surface of the epitaxial layer and a bipolar transistor of which the base and emitter regions are formed by the drain region of the MOSFET and a region of the second conductivity type within the drain region, the epitaxial layer constituting the collector of the bipolar transistor, in which the epitaxial layer is formed on a substrate of the first conductivity type, a highly doped buried layer of the second conductivity type is located at the interface of the epitaxial layer and the substrate, and an ohmic connection is made to the surface of the epitaxial layer as a collector contact.

In order that the invention may be fully understood and readily carried into effect it will now be described with reference to the accompanying drawings, of which:

Figure 1:
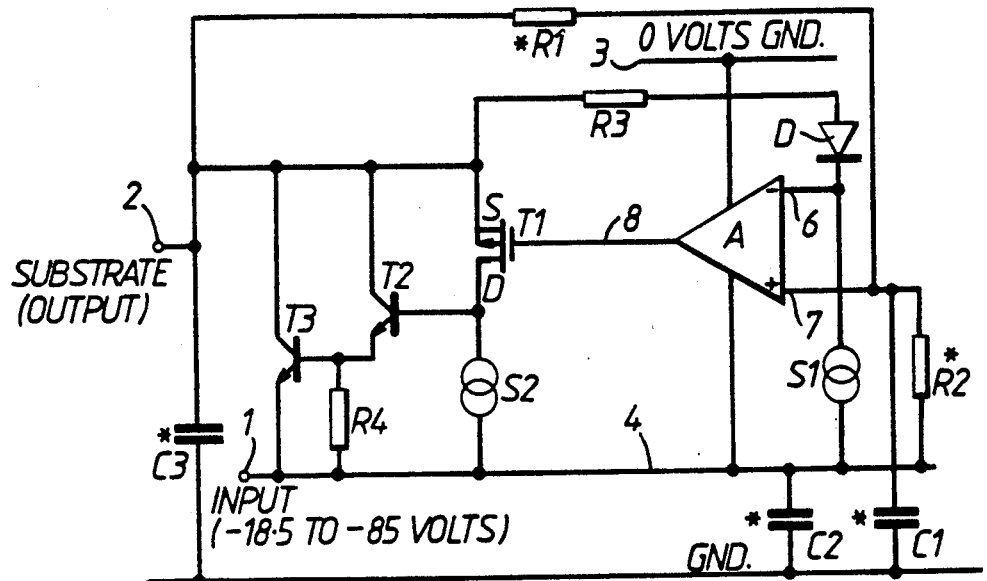
FIG. 1 is the circuit diagram of a circuit to be implemented in integrated circuit form, being the example on which the following description is based.

FIG. 1 is the circuit of a voltage regulator for a negative voltage supply which receives its input from a switched mode power supply connected to terminal 1. The darlington pair circuit of transistors T2 and T3 effect the regulation of the voltage which appears at output terminal 2 which as will be explained later constitutes the substrate of the integrated circuit relative to the input voltage on terminal 1. The conventional use of a voltage regulator is to regulate the output voltage relative to some reference value such as ground, and it will be understood that the circuit of FIG. 1 does not do that; in fact the function of the regulator in this instance is to reduce the output impedance of the power supply especially to a.c. signals appearing at the output of the supply from the amplifier or other apparatus which is powered by the supply, so that such a.c. signals are not transmitted through the supply to any other part of the system. A conductor 3 is connected to ground and an amplifier A is powered by the input supply applied to the terminal 1 and connected via a conductor 4 to the amplifier. The output 8 of the amplifier A is connected to the gate of a field effect transistor T1 of which the source is connected to the terminal 2 and the drain to the base of the transistor T2. The terminal 2 is connected through a resistor R1 which is external to the integrated circuit to be described to the non-inverting input 7 of the amplifier A which is connected through a second resistor R2 external to the integrated circuit to the conductor 4. The inverting input 6 of the amplifier A is connected through a diode D and a resistor R3 to the terminal 2 and also to a current source S1 connected to the conductor 4. Capacitors C1, C2 and C3 also external to the integrated circuit are provided connected respectively from the non-inverting input 7 of the amplifier A, the conductor 4 and the terminal 2 to ground.

In the operation of the circuit shown in FIG. 1, the diode D is caused to conduct by the current supplied by the source S1 so that the forward conduction voltage drop of the diode D of approximately 0.7 volts is set up between the terminal 2 and the inverting input 6 of the amplifier A, the magnitude of the current from the source S1 being so small that the voltage resulting from its flow through the resistor R3 does not set up a significant potential difference. The resistor R1 has a value of 1 Mohm and R2 has a value of 4 Mohms, as a result of which the output voltage at the terminal 2 is regulated at 3.5 volts relative to the conductor 4. This regulation arises because the amplifier A will control the conduction of the transistors T1, T2 and T3 so that the voltages applied ts inverting and non-inverting inputs 6 and 7 are equal which means that the potential difference set up across the resistor R1 due to current flow from the terminal 2 through the resistors R1 and R2 must be equal to the forward conduction potential of the diode D. Since R1 is one-quarter of the value of R2 it follows that the voltage drop across it is one-fifth of that between the terminal 2 and the conductor 4 with the result that the voltage is equal to 3.5 volts, being five times the 0.7 volt forward conduction voltage of the diode D.

Any change in the voltage at the terminal 2 from an external source, for example due to an audio signal from an amplifier powered by the supply, will be resisted by the regulator circuit because it will appear substantially unchanged apart from a constant shift of 0.7 volts at the inverting input 6 of the amplifier A. Although the changes will also appear at the non-inverting input 7 of the amplifier A they will be attenuated by the potentiometer formed by resistors R1 and R2, so that the output of the amplifier A tends to correct the voltage change. This effect appears as a very low output impedance of the power supply.

The regulator circuit described in FIG. 1 has its output terminal 2 connected to the substrate of the integrated circuit used to realise the circuit of FIG. 1 whereas a conventional regulator circuit would use the substrate connected to a reference voltage common to both the output circuit and the input from the switched mode power supply. This has the advantage that the noise which would otherwise appear on the substrate cannot be capacitatively coupled to other circuits formed on the same substrate such as, for example, audio amplifiers. In one embodiment of an integrated circuit using the invention the regulated power supply is applied to an audio amplifier for use in a telephone system and it will be apparent that in such an application any noise from the power supply which is communicated to the substrate will be picked up by the more sensitive input stages of the amplifier and would appear as unacceptably high levels at the output of the audio amplifier. The use of the regulator described in FIG. 1 avoids this.

Figure 5:
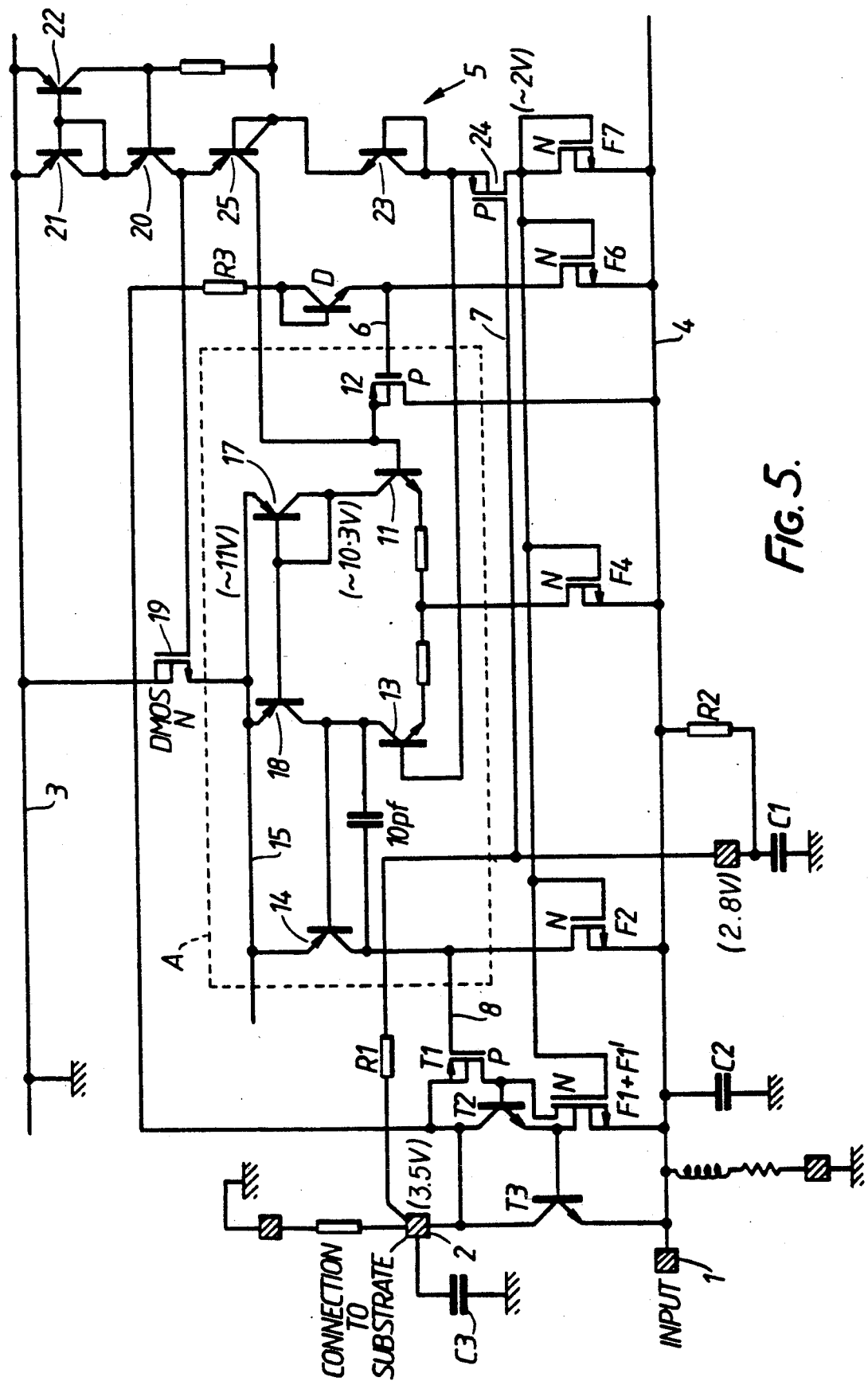
FIG. 5 shows the circuit of the integrated circuit form of FIG. 1.

FIG. 5 shows how FIG. 1 could be implemented in integrated circuit form and in that figure the components forming the amplifier A are enclosed in a dotted line rectangle marked A plus transistor 24. In addition, the components which correspond to those of FIG. 1 have the same references as in that figure. The components in FIG. 1 external to the integrated circuit are also shown in FIG. 5.

Figure 2:
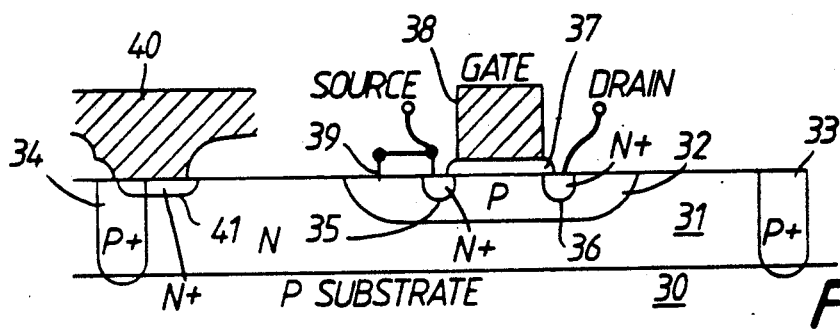
FIG. 2 shows the integrated circuit form of an N-channel MOSFET to be used in the example of the present invention.
Figure 3:
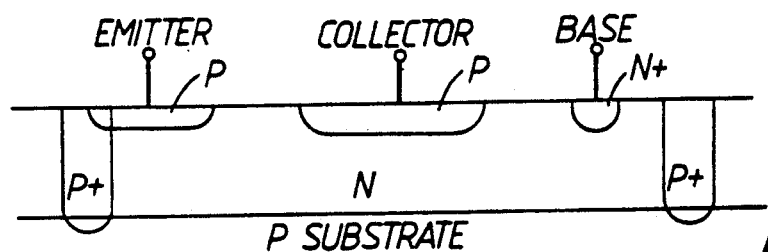
FIG. 3 shows the integrated circuit form of a PNP transistor used in the present example.
Figure 4:
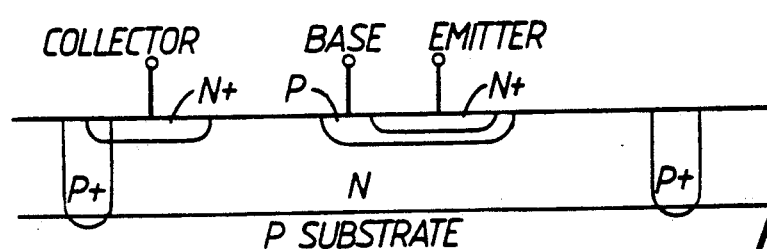
FIG. 4 shows the integrated circuit form of an NPN transistor used in the present example.

Consideration of the potential distribution within the circuit of FIG. 5 will reveal that some of the components operate at potentials which are positive relative to the substrate, itself being negative with respect to ground, the most positive potential shown in FIG. 5. Other components operate at potentials which are negative with respect to the substrate bearing in mind that the input voltage applied to the terminal 1 is negative and lies between 18.5 and 85 volts. With this distribution of potential it will be apparent that the N-channel MOSFETs F1+F1', F2, F4, F6 and F7 operate at potentials which are quite negative relative to that of the substrate. A chain of transistors 5 connected between the ground conductor 3 and the conductor 4 serve to control the MOSFETs F1+F1', F2, F4 and F6 so that they produce the currents required for the different parts of the circuit. In particular the MOSFET F6 functions as the current source S1 and feeds current to the diode-connected transistor which acts as the diode D and is connected to the inverting input 6 of the amplifier A. The non-inverting input 7 of the amplifier A is connected to the junction of the resistors R1 and R2 as in FIG. 1. The output 8 of the amplifier A drives the gate of the MOSFET T1 of which the source is connected to the substrate as in FIG. 1. The transistors T1, T2 and T3 are formed as a single component which will be described later with reference to FIGS. 6, 7 and 8. The N-channel MOSFETs have the structure shown in FIG. 2, the PNP transistors of the amplifier A and in the current regulating chain 5 are constructed as shown in FIG. 3 and the NPN bipolar transistors of the amplifier A, acting as the diode D and in the current regulating chain 5 are constructed as shown in FIG. 4. The P-channel MOSFETS may be as shown in FIG. 7.

The integrated circuit itself is constructed using the so-called BIDFET process which permits the formation of DMOS, NMOS, and PMOS and consequently CMOS, and bipolar transistors in the same integrated circuit. An outline description of the technology is given on page 49 of "Electronics" for Apr. 5, 1984 and U.S. Pat. Nos. 4 325 180 and 4 403 395. As described in those references, the transistors are all operated at potentials which are positive relative to the substrate and the present invention adds to that technology the possibility of other transistor structures which are operable at potentials which are negative relative to the substrate.

The inverting input 6 of the amplifier A is connected to the gate of a P-channel MOSFET 12 having its drain connected to the conductor 4 and its source connected to the base of a transistor 11 and to a collector of a transistor 25 in the chain 5. The non-inverting input 7 is connected to the gate of a P-channel MOSFET 24 in the chain 5, the source of which is connected to the base of a transistor 13 and through transistors 23 and 25 to a current source formed by transistors 20, 21 and 22. The emitters of the transistors 11 and 13 are connected together through resistors and to a common current source formed by the MOSFET F4. The collector of the transistor 13 is connected to the base of a transistor 14 of which the emitter is connected to a conductor 15 and the collector is connected to the output terminal 8 and to a current source formed by the MOSFET F2. A capacitor 16 is connected from collector to base of the transistor 14. The conductor 15 is connected through transistors 17 and 18 respectively to the collectors of the transistors 11 and 13. The bases of the transistors 17 and 18 are connected directly together and to the collector of the transistor 17 so that these transistors act as controlled collector loads for the transistors 11 and 13. The conductor 15 is also connected through an N-channel DMOS transistor 19 to the grounded conductor 3, the gate of the transistor 19 being connected to the collector of transistor 20 which forms part of the transistor chain 5. The transistor 20 is in fact connected to transistors 21 and 22 in a controlled current source circuit which feeds not only the gate of the transistor 19 but is also connected through transistor 25 which has two collectors, one connected directly to its base and the other to the base of the transistor 11 and the source of the transistor 12, a diode-connected transistor 23 and the P-channel MOSFET 24 to the drain and gate of MOSFET F7, and to the gates of the MOSFETs F1+F1', F2, F4 and F6, thereby to determine the currents produced by those MOSFETs which are connected to the amplifier A as described above and to other parts of the circuit. The MOSFET F1+F1' has two drains and acts as the current source 52 feeding the drain of transistor T1 and as a current source feeding the emitter of the transistor T2.

The PMOS transistors 12 and 24 operate as source follower input buffers to the amplifier A respectively for the inverting and non-inverting inputs. These have the effect of level shifting the inputs about 2 volts positively, this being the threshold voltage of the transistors 12 and 24. This level shift prevents both the transistors 11 and 13 from being cut off at the same time under any operating conditions which could cause latching up of the amplifier. The transistors 12 and 24 also provide the amplifier with high input impedances on both its inputs.

When constructed as an integrated circuit, the circuit of FIG. 5 is formed on a substrate of P-type conductivity with an N-type conductivity epitaxial layer formed on it. The N-channel MOSFETs F1+F1', F2, F4, F6 and F7 are all of the same basic construction but with differing channel widths so as to produce the different currents required by the different parts of the circuit. All of these MOSFETs are formed in a single well of P-type conductivity formed in a region of the epitaxial layer isolated from other regions by P+ conductivity isolation boundaries which extend through the epitaxial layer to the substrate. One such MOSFET is shown in diagrammatic form in FIG. 2 where the substrate is indicated by the reference 30, the epitaxial layer by 31, the P-type well by 32 and the isolation regions by 33 and 34. The source and drain of the transistor are formed by N+ conductivity regions 35 and 36 defining between them a channel region over which lies a film 37 of insulating oxide and gate metallisation 38. The source 35 has an ohmic connection 39 to the P-type well 32 which therefore is kept at the most negative potential of the circuit, that provided by the input on terminal 1. This large negative potential ensures that the PN junction between the well 32 and the epitaxial layer 31 is always reverse biased. The substrate potential, that is to say regulated output of the circuit, is applied via metallisation 40 to the isolation regions 34 and through that to the substrate, and also through an N+ conductivity region 41 which ensures that the epitaxial layer 31 is also kept at the substrate potential. Since the material of the well 32 is held at the most negative potential, it follows that parasitic bipolar transistors formed by the source and drain regions 35 and 36 together with the well 32 and the epitaxial layer 31 are prevented from becoming conductive. The maintenance of the epitaxial layer 31 as being slightly positive of the well 32 and at the same potential as the substrate 30 ensures that the transistor formed by the well 32, the layer 31 and the substrate 30 is also prevented from conducting.

The bipolar transistors are each formed in a separate isolated part of the epitaxial layer with P+-type isolation boundaries as in FIG. 3. These transistors are formed as lateral devices or conventional planar devices with surface connections rather than substrate connections for the collectors. FIG. 3 shows a lateral PNP device and FIG. 4 shows an NPN device. A buried layer of N+ conductivity could be provided at the substrate/epitaxial layer interface to reduce the collector impedance of the transistor.

The construction of other types of transistors using the BIDFET process may be found on page 149 of Electronics for Apr. 5, 1984 and in U.S. Pat. No. 4 325 180 and 4 403 395 referred to above.

Figure 6:
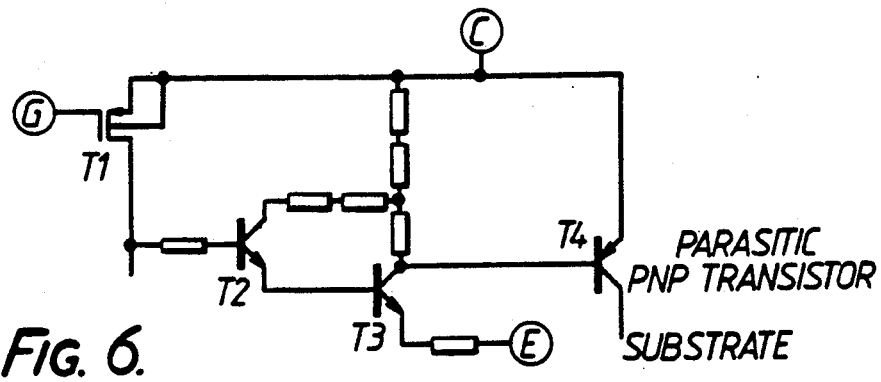
FIG. 6 shows in detail part of the circuit of FIG. 5.
Figure 7:
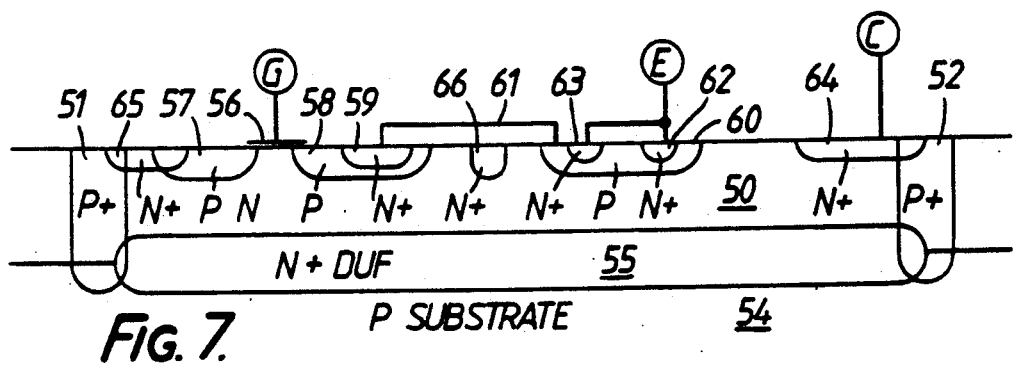
FIG. 7 shows the cross-section of an integrated circuit form of FIG. 6.
Figure 8:
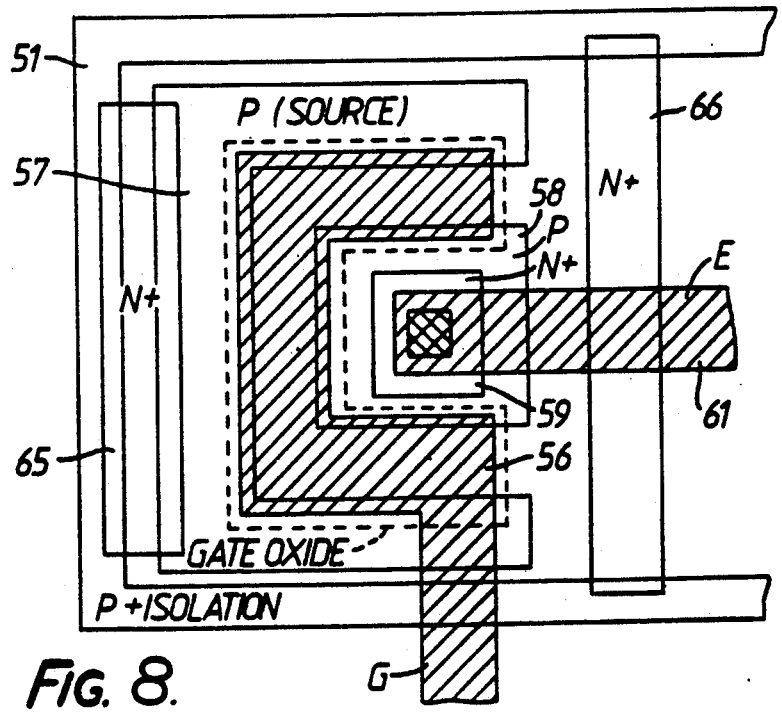
FIG. 8 shows a plan view of part of the integrated circuit form of FIG. 6.

The transistors T1, T2 and T3 are constructed as a single unit as shown in FIGS. 6, 7 and 8. In FIG. 6, the circuit is shown with the gate of the transistor T1 marked as G, the emitter of the transistor T3 marked as E and the collector connection for the transistors T1 and T2, which is also connected to the source of the transistor T1, marked as C. A parasitic PNP transistor T4 is also shown in FIG. 6 with its emitter connected to the collector connection C, its base connected to the collector of the transistor T3 and its collector connected to the substrate.

FIG. 7 shows the construction of the unit in an isolated region 50 of N-type epitaxial layer bounded by P+ type isolation regions 51 and 52. The interface between the epitaxial layer 50 and P-type substrate 54 has an N+ buried layer 55. A gate connection G is connected to gate metallisation 56 which overlies the channel of the transistor T1 formed between source region 57 of P-type conductivity and drain region 58 also of P-type conductivity. The region 58 also acts as the base region of the transistor T2 and has an N+ conductivity region 59 formed in it which acts as the emitter of that transistor. The epitaxial layer 50 forms the collector of the transistor T2. A further P-type region 60 forms the base of the transistor T3 which is joined by connection 61 to the emitter region 59 of the transistor T2. An emitter connection E is connected to two N+ regions 62 and 63 which together form the emitter of the transistor T3. The collector of the transistor T3 is formed by the epitaxial layer 50 which is connected by an N+ region 64 to the terminal C. A further N+ region 65 which overlies the isolation region 51 and the region 57 forming the source of the transistor T1 is provided. An N+ region 66 is formed adjacent the region 58 and is connected to the isolation regions.

Since the collectors of transistors T2 and T3 and the source of transistor T1 are connected to the substrate as shown in FIGS. 1 and 5, it can be seen that this connection is provided by the regions 64 and 65 which connect these regions through the isolation regions 51 and 52 to the substrate. The buried layer 55 and the region 66 serve to reduce the resistance of the connections to the collector regions of transistors T2 and T3. In addition, the region 65 provides an ohmic connection from the source 57 of transistor T1 to the epitaxial layer 50 thereby providing the required back gate connection for this transistor. The isolation regions 51 and 52 form the parasitic PNP transistor with the epitaxial layer 50 and the substrate 54 but since the regions 51 and 52 are connected to the substrate 54 the transistor is effectively short-circuited and does not interfere with the operation of the unit.

FIG. 8 shows the plan view of part of the unit shown in FIG. 7 with the gate metallisation G and the emitter metallisation E shown as hatched areas. The cross-hatching at one end of the emitter metallisation represents the connection to the emitter region 59 through the surface oxide of the integrated circuit. The parts of FIG. 8 which correspond to those of FIG. 7 have the same reference numbers as in that figure from which it will be apparent that the source region 57 of the MOSFET is C-shaped and surrounds three of the four sides of the square drain region 58. The collector connection region 66 extends along the fourth side of the square drain region 58 between elongated portions of the boundary P+ isolation region 51.

We claim:

1. An integrated circuit comprising:
    a semiconductor substrate;
    a plurality of semiconductor circuit components on said semiconductor substrate;
    said plurality of semiconductor circuit components including respective first and second groups of semiconductor circuit components interconnected in a single circuit;
    said first group of semiconductor circuit components including at least one transistor having a plurality of electrodes and at all of whose electrodes appear potentials which are positive with respect to said substrate;
    said second group of semiconductor circuit components including at least one transistor having a plurality of electrodes and at all of whose electrodes appear potentials which are negative with respect to said substrate; and
    means providing reverse-biased PN junctions electrically isolating at least some of said plurality of semiconductor circuit components included in said first and second groups of semiconductor circuit components from each other.

2. An integrated circuit as set forth in claim 1, wherein said semiconductor substrate is of P-type conductivity, and further including
    an epitaxial layer of N-type conductivity provided on said semiconductor substrate;
    said plurality of semiconductor circuit components being defined in said N-type conductivity epitaxial layer; and
    a plurality of P+-type regions defined in said N-type conductivity epitaxial layer and extending therethrough to said semiconductor substrate, said plurality of P+-type regions cooperating with said N-type epitaxial layer so as to define said reverse-biased PN junctions electrically isolating said at least some of said plurality of semiconductor circuit components included in said first and second groups of semiconductor circuit components from each other.

3. An integrated circuit as set forth in claim 2, wherein said first group of semiconductor circuit components includes at least one bipolar transistor having emitter, base, and collector electrodes, the base electrode being defined by said epitaxial layer of N-type conductivity; and
    a pair of regions of P-type conductivity provided in said epitaxial layer of N-type conductivity in laterally spaced relationship with respect to each other and defining the emitter and collector electrodes respectively such that said at least one bipolar transistor is a lateral PNP bipolar transistor.

4. An integrated circuit as set forth in claim 2, wherein said first group of semiconductor circuit components includes at least one bipolar transistor having emitter, base, and collector electrodes, the collector electrode being defined by said epitaxial layer of N-type conductivity;
    a region of P-type conductivity provided in said epitaxial layer of N-type conductivity and defining the base electrode of said at least one bipolar transistor; and
    a region of N-type conductivity provided in said region of P-type conductivity and defining the emitter electrode of said at least one bipolar transistor, wherein said at least one bipolar transistor is an NPN bipolar transistor.

5. An integrated circuit as set forth in claim 2, further including a well region of P-type conductivity provided in said N-type conductivity epitaxial layer and extending to the surface thereof;
    a pair of spaced dopant regions of N-type conductivity provided in said P-type well region of said N-type epitaxial layer; and
    said pair of spaced N-type dopant regions provided in said P-type well region of said N-type epitaxial layer serving as source and drain regions respectively of an NMOS enhancement mode field effect transistor;

said NMOS enhancement mode field effect transistor being including in said second group of semiconductor circuit components.

6. An integrated circuit as set forth in claim 2, further including at least one PMOS enhancement mode field effect transistor having respective source and drain regions of P-type conductivity provided in said epitaxial layer and whose N-type conductivity channel between said P-type source and drain regions is defined by said epitaxial layer.

7. An integrated circuit as set forth in claim 6, further including a pair of NPN bipolar transistors arranged in a Darlington configuration;

the P-type conductivity drain region of said PMOS enhancement mode field effect transistor being the base of the input transistor of said pair of NPN bipolar transistors arranged in the Darlington configuration; and a highly doped N-type buried diffusion region disposed beneath said pair of NPN bipolar transistors arranged in the Darlington configuration between said N-type conductivity epitaxial layer and said P-type conductivity semiconductor substrate.

8. A integrated circuit comprising:
a semiconductor substrate of one conductivity type having a top surface;
an epitaxial layer of semiconductor material of the other conductivity type opposite to said one conductivity type disposed on the top surface of said semiconductor substrate;
a plurality of regions of said one conductivity type extending through said epitaxial layer of the other conductivity type from the top surface thereof to the top surface of said semiconductor substrate of said one conductivity type to define respective electrically isolating PN junctions for reverse biasing operation and dividing said epitaxial layer of the other conductivity type into a plurality of electrically isolated regions;
at least one first transistor formed in certain electrically isolated regions of said epitaxial layer;
well regions of said one conductivity type formed in other electrically isolated regions of said epitaxial layer and opening onto the top surface thereof;
field effect transistors formed in said well regions of said one conductivity type as provided in said other electrically isolated regions of said epitaxial layer;
said first transistors and said field effect transistors being interconnected in a single circuit;
each of said first transistors in said single circuit having a plurality of electrodes and at all of whose electrodes appear potentials of one polarity relative to said semiconductor substrate of said one conductivity type; and
each of said field effect transistors in said single circuit having a plurality of electrodes and at all of whose electrodes appear potentials of the other polarity opposite to said one polarity with respect to said semiconductor substrate of said one conductivity type.

9. An integrated circuit as set forth in claim 8, further including highly doped buried diffusion regions of said other conductivity type provided in at least some of the electrically isolated regions of said epitaxial layer along the interface between said epitaxial layer and said semiconductor substrate.

10. An integrated circuit as set forth in claim 9, wherein said single circuit has a circuit configuration including a MOSFET input component directly connected to a bipolar transistor output component;

both of said MOSFET input component and said bipolar transistor output component being defined in said epitaxial layer, said epitaxial layer forming the channel of said MOSFET and the collector of said bipolar transistor; and a dopant region of said one conductivity type within said epitaxial layer, said dopant region of said one conductivity type acting as the drain of said MOSFET and also serving as the base of said bipolar transistor.

11. An integrated circuit comprising:
a semiconductor substrate of one conductivity type having a top surface;
an epitaxial layer of semiconductor material of the other conductivity type opposite to said one conductivity type disposed on the top surface of said semiconductor substrate;
a plurality of regions of said one conductivity type extending through said epitaxial layer of the other conductivity type from the top surface thereof to the top surface of said semiconductor substrate of said one conductivity type to define respective electrically isolating PN junctions for reverse biasing operation and dividing said epitaxial layer of the other conductivity type into a plurality of electrically isolated regions;
at least one first transistor formed in certain electrically isolated regions of said epitaxial layer;
well regions of said one conductivity type formed in other electrically isolated regions of said epitaxial layer and opening onto the top surface thereof;
field effect transistors formed in said well regions of said one conductivity type as provided in said other electrically isolated regions of said epitaxial layer;
said first transistors and said field effect transistors being interconnected in a single circuit;
each of said first transistors in said single circuit having a plurality of electrodes and at all of whose electrodes appear potentials of one polarity relative to said semiconductor substrate of said one conductivity type;
each of said field effect transistors in said single circuit having a plurality of electrodes and at all of whose electrodes appear potentials of the other polarity opposite to said one polarity with respect to said semiconductor substrate of said one conductivity type;
said single circuit having a circuit configuration including a MOSFET input component as one of said field effect transistors directly connected to a bipolar transistor output component as one of said first transistors;
both of said MOSFET input component and said bipolar transistor output component being defined in said epitaxial layer, said epitaxial layer forming the channel of said MOSFET and the collector of said bipolar transistor;
first and second dopant regions of said one conductivity type within said epitaxial layer and respectively serving as source and drain regions of said MOSFET, said dopant region of said one conductivity type acting as the drain of said MOSFET also serving as the base of said bipolar transistor;

said MOSFET input component comprising an enhancement mode MOSFET having an insulated gate overlying the surface of said channel formed in said epitaxial layer between the source and drain regions of said one conductivity type defined in the surface of said epitaxial layer;

said bipolar transistor output component having its base and emitter regions defined by the drain region of said MOSFET input component and a region of said other conductivity type within said drain regions respectively;

a buried layer of said other conductivity type at a high concentration located at the interface of said epitaxial layer and said semiconductor substrate; and an ohmic connection on the surface of said epitaxial layer as the collector contact for said bipolar transistor output component.

12. An integrated circuit as set forth in claim 11, further including an ohmic connection to said semiconductor substrate;

said single circuit providing a voltage regulator for a negative voltage supply; and a regulated voltage output being obtained from said ohmic connection to said semiconductor substrate.

* * * * *